US008780517B2

(12) United States Patent
Fukami

(10) Patent No.: US 8,780,517 B2
(45) Date of Patent: Jul. 15, 2014

(54) SEMICONDUCTOR APPARATUS AND TEMPERATURE DETECTION CIRCUIT

(75) Inventor: Ikuo Fukami, Kanagawa (JP)

(73) Assignee: Renesas Electronics Corporation, Kanagawa (JP)

(*) Notice: Subject to any disclaimer, the term of this patent is extended or adjusted under 35 U.S.C. 154(b) by 981 days.

(21) Appl. No.: 12/772,638

(22) Filed: May 3, 2010

(65) Prior Publication Data
US 2010/0321846 A1 Dec. 23, 2010

(30) Foreign Application Priority Data

Jun. 19, 2009 (JP) ................................. 2009-146178

(51) Int. Cl.
*H02H 5/04* (2006.01)
(52) U.S. Cl.
USPC .......................................................... 361/93.8
(58) Field of Classification Search
USPC .......................................................... 361/93.8
See application file for complete search history.

(56) References Cited

U.S. PATENT DOCUMENTS

| | | | |
|---|---|---|---|
| 4,903,106 A * | 2/1990 | Fukunaga et al. | 257/378 |
| 5,237,481 A * | 8/1993 | Soo et al. | 361/103 |
| 5,726,481 A | 3/1998 | Moody | |
| 6,046,470 A | 4/2000 | Williams et al. | |
| 6,504,697 B1 * | 1/2003 | Hille | 361/103 |
| 7,541,858 B2 | 6/2009 | Yukutake et al. | |
| 2006/0022609 A1 | 2/2006 | Yukutake et al. | |
| 2006/0249783 A1 * | 11/2006 | Lojek | 257/327 |

FOREIGN PATENT DOCUMENTS

| | | |
|---|---|---|
| JP | 6-232410 A | 8/1994 |
| JP | 10-505714 A | 6/1998 |
| JP | 2006-37822 | 2/2006 |
| JP | 2007-335932 A | 12/2007 |

* cited by examiner

*Primary Examiner* — Rexford Barnie
*Assistant Examiner* — Ann Hoang
(74) *Attorney, Agent, or Firm* — Foley & Lardner LLP

(57) ABSTRACT

Provided is a semiconductor apparatus which includes a power transistor that is placed between an input terminal and an output terminal, a temperature detection diode that has a cathode connected to the input terminal and an anode connected to the output terminal, a current amplifier that outputs a detection current generated by amplifying a backward leakage current flowing from the cathode to the anode of the temperature detection diode, a first conversion resistor that outputs an overheat detection signal generated by converting the detection current into a voltage, a gating circuit that performs gating of a control signal according to the overheat detection signal, and a driver circuit that outputs a drive signal to a control terminal of the power transistor based on an output signal of the gating circuit.

12 Claims, 7 Drawing Sheets

SEMICONDUCTOR APPARATUS AND TEMPERATURE DETECTION CIRCUIT

INCORPORATION BY REFERENCE

This application is based upon and claims the benefit of priority from Japanese patent application No. 2009-146178, filed on Jun. 19, 2009, the disclosure of which is incorporated herein in its entirety by reference.

BACKGROUND

1. Field of the Invention

The present invention relates to a semiconductor apparatus and a temperature detection circuit, and, particularly, to a semiconductor apparatus including a power transistor that outputs a large current and a temperature detection circuit.

2. Description of Related Art

Recently, a power transistor has been often used in power control of a controlled circuit that consumes a large current. The controlled circuit is a motor or the like, for example. In a power transistor that is used in such applications, heating of a device is prevented by lowering resistance during conduction and letting several tens of amperes of current flow. However, when anomaly occurs in the controlled circuit, an excessive current which is larger than a normally expected current flows, which causes heating and breaking of the power transistor. To avoid this, a power supply circuit that uses a power transistor turns off the power transistor upon occurrence of overheating in the power transistor, thereby preventing thermal breakdown of a device. A temperature detection circuit is used as a protection circuit against overheating.

Examples of such a protection circuit are disclosed in U.S. Pat. No. 6,046,470 and Japanese Unexamined Patent Application Publication No. 06-232410. A protection circuit 100 disclosed in U.S. Pat. No. 6,046,470 is described firstly. FIG. 8 shows a circuit diagram of the protection circuit 100. As shown in FIG. 8, the protection circuit 100 detects the overheated state of a MOSFET 110 and setting a signal VOUT to High level. In the protection circuit 100, a forward bias voltage Vbe is generated by making a current Ibias from a current source 101 flow from an anode to a cathode of a diode D2. In the protection circuit 100, the forward bias voltage Vbe is amplified by an amplifier 102. Then, the amplified forward bias voltage Vbe is compared with a reference voltage VREF in a comparator 103, thereby determining a logical level of the signal VOUT. The forward bias voltage Vbe has characteristics that vary with temperature. Thus, the protection circuit 100 detects the overheated state of the MOSFET 110 by detecting that the forward bias voltage Vbe falls below a predetermined voltage.

FIG. 9 shows an equivalent circuit of a MOS semiconductor device 200 disclosed in Japanese Unexamined Patent Application Publication No. 06-232410. In the MOS semiconductor device 200, a MOS transistor 210, a diode 220 that detects the temperature of the MOS transistor 210 and a resistor 230 are formed on one semiconductor substrate. In the MOS semiconductor device 200, the diode 220 and the resistor 230 are connected in series between the gate and the source of the MOS transistor 210. The cathode of the diode 220 is connected to the gate of the MOS transistor 210, and the anode of the diode 220 is connected to the source of the MOS transistor 210. Further, the resistor 230 is connected between the cathode of the diode 220 and the gate of the MOS transistor 210. In the MOS semiconductor device 200, when a gate voltage is applied to the MOS transistor 210, a reverse voltage is applied to the diode 220. The backward leakage current in the diode 220 increases with the temperature rise of the semiconductor substrate, and upon reaching a predetermined temperature, the logical level of a detection signal So that is output from a node between the resistor 230 and the diode 220 changes from High level to Low level. In the MOS semiconductor device 200, a voltage draw-out circuit is made to operate from a gate terminal according to the logical level of the detection signal So, thereby protecting the MOS transistor 210 from overheat breakdown.

SUMMARY

However, the techniques disclosed in U.S. Pat. No. 6,046,470 and Japanese Unexamined Patent Application Publication No. 06-232410 have a problem that the overheated state of the power transistor cannot be detected at high speed. In the technique of U.S. Pat. No. 6,046,470 that detects the overheated state by amplifying the forward bias voltage Vbe of the diode, because a change in the forward bias voltage Vbe of the diode with respect to temperature is small (e.g. $-2$ mV/° C.), the accuracy of temperature detection cannot be increased. Although it is necessary to detect the temperature of the power transistor with high accuracy in order to detect the overheated state at high speed, the technique of U.S. Pat. No. 6,046,470 fails to ensure the high detection accuracy.

Further, although the technique disclosed in Japanese Unexamined Patent Application Publication No. 06-232410 generates the detection signal So based on the backward leakage current flowing through the diode, the value of the backward leakage current is small. Thus, the technique of Japanese Unexamined Patent Application Publication No. 06-232410 also has a problem that the detection accuracy is low and the detection speed of the overheated state cannot be increased.

Because the power transistor flows a large current, if the detection speed of the overheated state is low, there is the possibility of breakdown before starting protection.

A first exemplary aspect of the present invention is a semiconductor apparatus which includes a power transistor that is placed between an input terminal and an output terminal, a temperature detection diode that has a cathode connected to the input terminal and an anode connected to the output terminal, a current amplifier that outputs a detection current generated by amplifying a backward leakage current flowing from the cathode to the anode of the temperature detection diode, a first conversion resistor that outputs an overheat detection signal generated by converting the detection current into a voltage, a gating circuit that performs gating of a control signal according to the overheat detection signal, and a driver circuit that outputs a drive signal to a control terminal of the power transistor based on an output signal of the gating circuit.

A second exemplary aspect of the present invention is a temperature detection circuit which includes a temperature detection diode that is placed in parallel with a power transistor between an input terminal and an output terminal and has a cathode connected to the input terminal and an anode connected to the output terminal, a current amplifier that outputs a detection current generated by amplifying a backward leakage current flowing from the cathode to the anode of the temperature detection diode, and a first conversion resistor that outputs an overheat detection signal generated by converting the detection current into a voltage.

In the semiconductor apparatus and the temperature detection circuit according to the exemplary aspects of the present invention, the detection current is generated by amplifying the backward leakage current of the diode with a high rate of change with respect to temperature. Then, the overvoltage detection signal is output by converting the detection current into a voltage. It is thereby possible to perform temperature detection of the power transistor at high speed based on highly accurate temperature measurement in the semiconductor apparatus and the temperature detection circuit according to the exemplary aspects of the present invention.

In the semiconductor apparatus according to the exemplary aspect of the present invention described above, it is possible to detect the temperature of a power transistor at high speed and improve the accuracy of overheat protection of the power transistor.

BRIEF DESCRIPTION OF THE DRAWINGS

The above and other exemplary aspects, advantages and features will be more apparent from the following description of certain exemplary embodiments taken in conjunction with the accompanying drawings, in which.

DETAILED DESCRIPTION OF THE EXEMPLARY EMBODIMENTS

[First Exemplary Embodiment]

Figure 1:
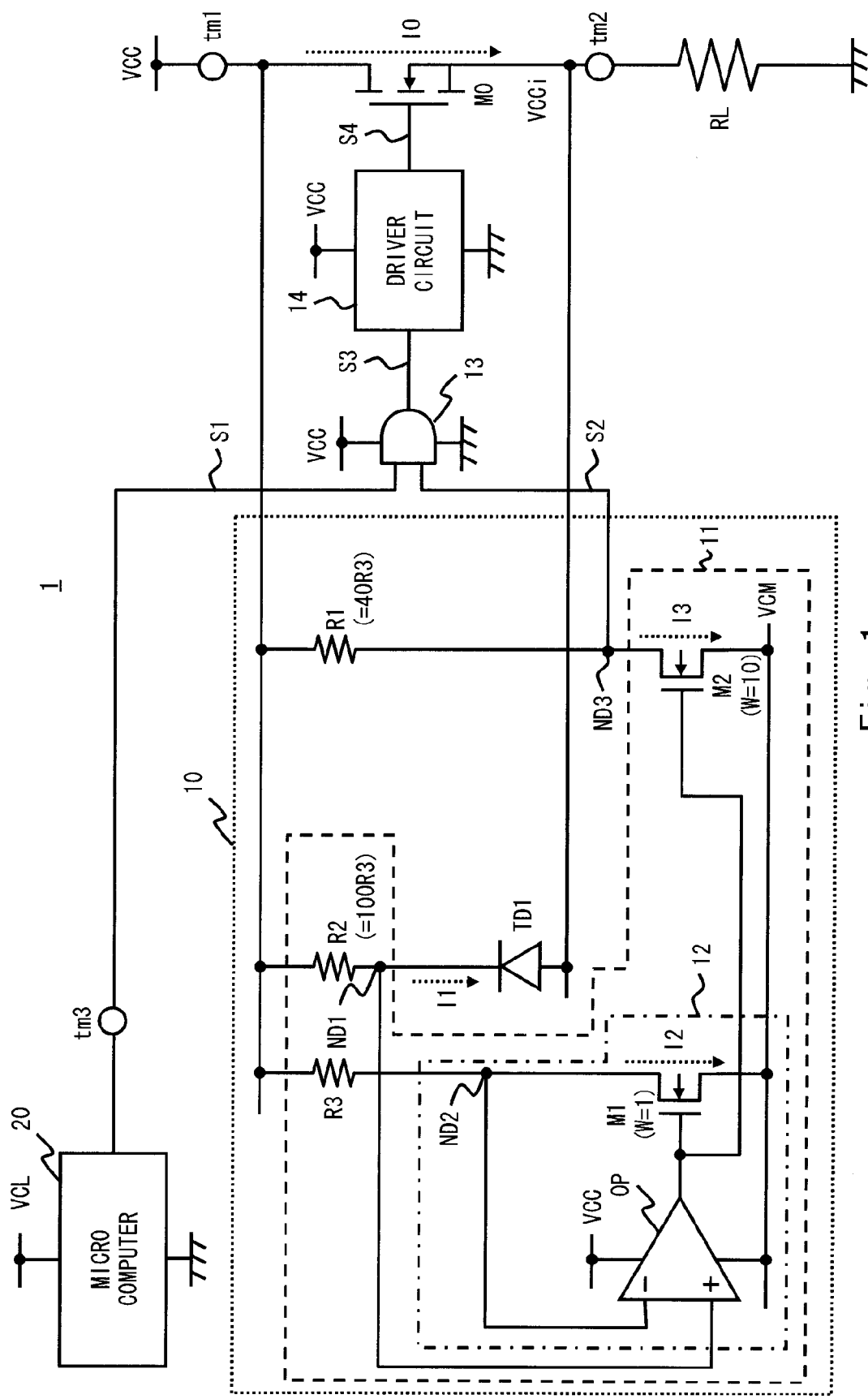
FIG. 1 is a block diagram of a semiconductor apparatus according to a first exemplary embodiment.

An exemplary embodiment of the present invention is described hereinafter with reference to the drawings. FIG. 1 is a block diagram of a semiconductor apparatus 1 according to a first exemplary embodiment. Referring to FIG. 1, the semiconductor apparatus 1 includes a power transistor M0, a temperature detection circuit 10, a gating circuit 13 and a driver circuit 14. The semiconductor apparatus 1 further includes an input terminal tm1, an output terminal tm2, and a control signal input terminal tm3. The input terminal tm1 is a terminal for inputting a power supply voltage VCC that is supplied from an external power supply. The output terminal tm2 is a terminal to which a load RL acting as a controlled circuit is connected, and it is a terminal for outputting an internal power supply voltage VCCi that is supplied to the load RL through the power transistor M0. The control signal input terminal tm3 is a terminal for inputting a control signal S1 that is generated by a microcomputer 20 placed externally. The microcomputer 20 operates based on a power supply with a voltage VCL (e.g. 5V) that is lower than the power supply voltage VCC.

The power transistor M0 is an N-type MOS transistor, for example. In this exemplary embodiment, a planar-type vertical MOS transistor is used as the power transistor M0. The drain of the power transistor M0 is connected to the input terminal tm1, the source of the power transistor M0 is connected to the output terminal tm2, and a drive signal S4 that is output from the driver circuit 14 is applied to the gate of the power transistor M0.

The temperature detection circuit 10 is a circuit that detects the temperature of the power transistor M0. The temperature detection circuit 10 according to the exemplary embodiment includes a temperature detection diode TD1, a current amplifier 11 and a first conversion resistor R1. The temperature detection diode TD1 is placed in parallel with the power transistor between the input terminal tm1 and the output terminal tm2. The cathode of the temperature detection diode TD1 is connected to the input terminal tm1, and the anode of the temperature detection diode TD1 is connected to the output terminal tm2. A backward leakage current I1 flows from the cathode to the anode of the temperature detection diode TD1, and the amount of the backward leakage current I1 increases or decreases according to the temperature of the semiconductor substrate. The detail of the temperature detection diode TD1 is described later.

The current amplifier 11 amplifies the backward leakage current I1 flowing through the temperature detection diode TD1 and outputs the amplified current as a detection current I3. The current amplifier 11 includes a second conversion resistor R2, a third conversion resistor R3, a buffer circuit 12, and a second internal output transistor M2. The current amplifier 11 operates based on a first voltage (e.g. the power supply voltage VCC) that is input to the input terminal tm1 and a second voltage (e.g. an intermediate voltage VCM) that is lower than the power supply voltage VCC.

The second conversion resistor R2 is connected between the cathode of the temperature detection diode TD1 and the input terminal tm1, and it converts the backward leakage current I1 into a voltage and generates a leakage voltage. The leakage voltage is generated at a node ND1 between the second conversion resistor R2 and the cathode of the temperature detection diode TD1. Thus, the leakage voltage is a voltage represented as VCC−R2×I1.

The third conversion resistor R3 is connected between an internal output node ND2 of the buffer circuit 12 and the input terminal tm1. At the internal output node ND2, the buffer circuit 12 generates a reference voltage corresponding to the leakage voltage according to the current flowing through the third conversion resistor R3. The buffer circuit 12 includes a differential amplifier OP and a first internal output transistor M1. The leakage current (the voltage at the node ND1) is input to a non-inverting input terminal of the differential amplifier OP, and a reference voltage (the voltage at the internal output node ND2) is input to an inverting input terminal of the differential amplifier OP. The output of the differential amplifier OP is connected to the gate of the first internal output transistor M1. The source of the first internal output transistor M1 is connected to an internal power supply terminal (e.g. an intermediate power supply) that supplies the intermediate voltage VCM. The drain of the first internal output transistor M1 is connected to the input terminal tm1 through the third conversion resistor R3. The drain of the first internal output transistor M1 serves as the internal output node ND2 and is connected to the non-inverting input terminal of the differential amplifier OP.

Thus, the buffer circuit 12 controls the gate of the first internal output transistor M1 in such a way that the leakage voltage and the reference voltage become the same. The buffer circuit 12 generates the reference voltage based on the product of an amplified current I2 flowing through the first internal output transistor M1 and a resistance of the third conversion resistor R3. In this exemplary embodiment, the resistance ratio of the second conversion resistor R2 and the third conversion resistor R3 is 100:1. Therefore, in the state where the leakage voltage and the reference voltage are equal, the amount of the amplified current I2 is 100 times that of the backward leakage current I1.

The control terminal (e.g. the gate) of the second internal output transistor M2 is connected in common to the gate of the first internal output transistor M1 in the buffer circuit 12, and the source of the second internal output transistor M2 is connected to the internal power supply terminal that supplies the intermediate voltage VCM, and the drain of the second internal output transistor M2 is connected to the input terminal through the first conversion resistor R1. In this exemplary embodiment, it is assumed that the transistor size (e.g. the gate width W) of the second internal output transistor M2 is 10 times that of the first internal output transistor M1. The detection current I3 that is output from the second internal output transistor M2 is thereby 10 times the amplified current I2 that is output from the first internal output transistor M1. Accordingly, the detection current I3 is 1000 times larger than the backward leakage current I1.

As described above, the current gain of the current amplifier 11 is determined by the product of a first amplification ratio indicating the resistance ratio of the second conversion resistor R2 and the third conversion resistor R3 and a second amplification ratio indicating the transistor size ratio of the first internal output transistor M1 and the second internal output transistor M2.

The first conversion resistor R1 outputs an overheat detection signal S2 that is converted from the detection current I3. The voltage level of the overheat detection signal S2 is represented by the expression of VCC−R1×I3. Thus, the resistance value of the first conversion resistor R1 is determined in consideration of the amount of the detection current I3 corresponding to the temperature to be detected and a determination threshold of a circuit in the subsequent stage that receives the overheat detection signal S2. In this exemplary embodiment, the resistance value of the first conversion resistor R1 is 40 times that of the third conversion resistor R3.

The gating circuit 13 receives the control signal S1 and the overheat detection signal S2, and performs gating of the control signal S1 according to the logical level of the overheat detection signal S2. Specifically, when the logical level of the overheat detection signal S2 is High level (overheat detected state), the gating circuit 13 outputs the control signal S1 as an output signal S3. On the other hand, when the logical level of the overheat detection signal S2 is Low level (overheat undetected state), the gating circuit 13 cuts off the control signal S1 and sets the output signal S3 to Low level.

In this exemplary embodiment, the gating circuit 13 operates by receiving supply of the power supply voltage VCC and a ground voltage. Further, the signals input to the gating circuit 13 have different amplitude ranges from each other. For example, the control signal S1 has the amplitude range of 0V to VCL (e.g. 0V to 5V) corresponding to the power supply voltage range of the microcomputer 20, and the overheat detection signal S2 has the amplitude range of VCM to VCC (e.g. 9V to 14V) corresponding to the power supply voltage range of the current amplifier 11. The gating circuit 13 in this exemplary embodiment incorporates a level shifter that shifts the amplitude range of the control signal S1 to the amplitude range of the overheat detection signal S2. Then, the gating circuit 13 determines the level of the output signal S3 based on the control signal S1 after level shift and the overheat detection signal S2 without level shift.

The driver circuit 14 outputs a drive signal S4 to the control terminal (e.g. the gate) of the power transistor M0 based on the output signal S3 of the gating circuit 13. The logical level of the drive signal S4 is determined according to the control signal S1 that is supplied as the output signal S3, for example. Further, a High-level voltage of the drive signal S4 is a voltage level that is stepped up from the power supply voltage VCC, and a Low-level voltage of the drive signal S4 is a ground voltage.

Figure 2:
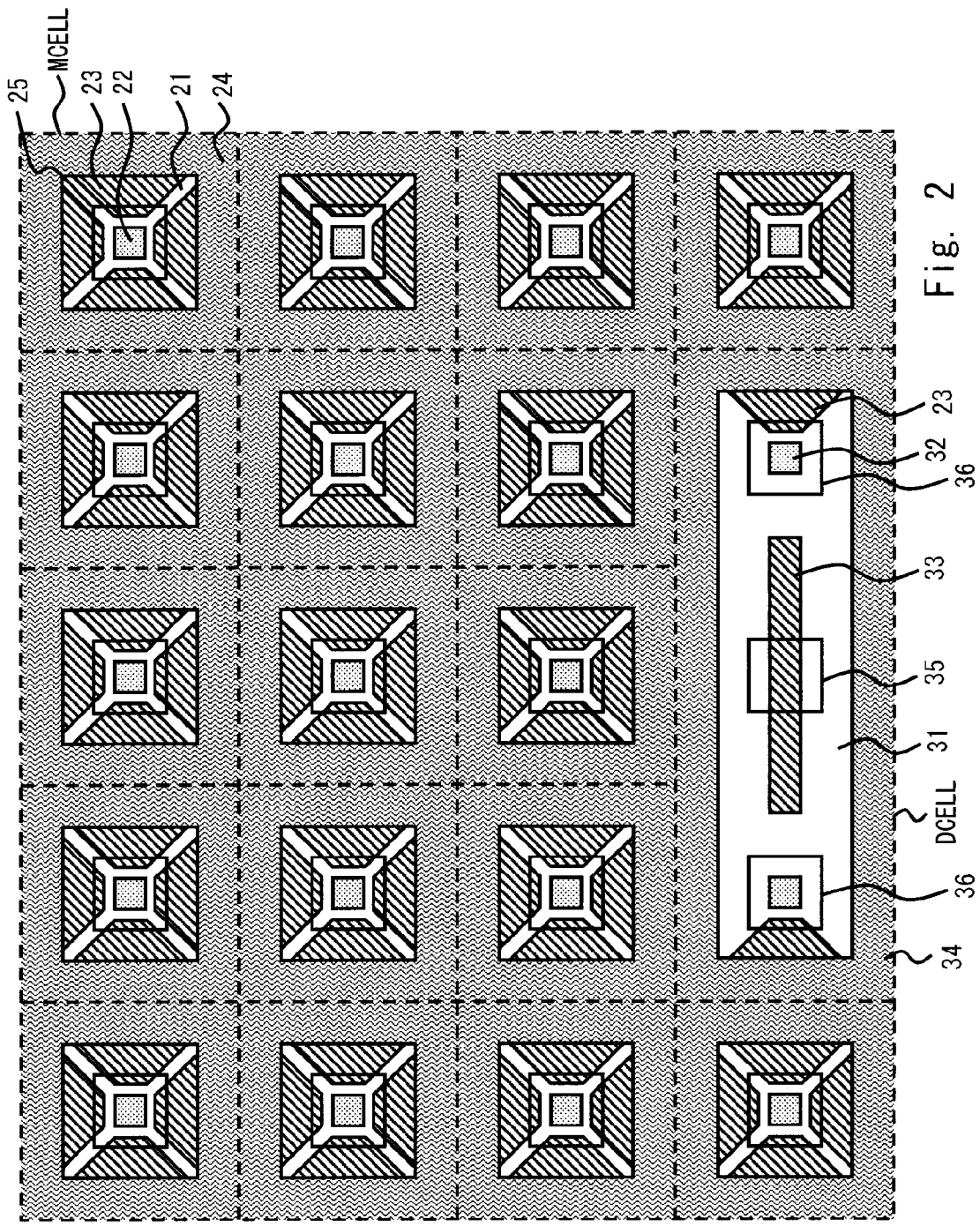
FIG. 2 is a layout view of a power transistor and a temperature detection diode according to the first exemplary embodiment.

Hereinafter, the temperature detection diode TD1 according to the exemplary embodiment is described in detail. The temperature detection diode TD1 is formed adjacent to the area where the power transistor M0 is formed. FIG. 2 is a layout view of the temperature detection diode TD1 and the power transistor M0. The layout view of FIG. 2 shows a part of the semiconductor apparatus 1, and the semiconductor apparatus 1 further includes a part not shown therein.

As shown in FIG. 2, the power transistor M0 is composed of a plurality of MOS cells MCELL. In the position adjacent to the MOS cells MCELL, a diode cell DCELL to serve as the temperature detection diode TD1 is formed. In the example of FIG. 2, the diode cell DCELL has a size corresponding to three MOS cells MCELL.

Each MOS cell MCELL includes a base region 21, a base pull tap region 22, a source region 23, a gate electrode 24 and a contact hole 25. The base region 21 is a region corresponds to a back gate region of the power transistor M0, and it is made of P-type semiconductor. The base pull tap region 22 is a region that electrically connects the base region 21 and a wiring layer (wiring 26 in FIG. 3), and it is made of P-type semiconductor with a higher impurity concentration than the base region 21. The source region 23 forms a source region of the power transistor M0 and is made of N-type semiconductor with a high impurity concentration. The gate electrode 24 is a gate of the power transistor M0, and it is made of polysilicon. The contact hole 25 is a region where the wiring 26 in FIG. 3 is formed.

The diode cell DCELL includes a base region 31, a base pull tap region 32, a cathode region 33, a gate electrode 34, a first contact hole 35, and a second contact hole 36. The base region 31 is a region corresponding to the anode region of the temperature detection diode TD1, and it is made of P-type semiconductor. The base pull tap region 32 is a region that electrically connects the base region 31 and a wiring layer (wiring 26 in FIG. 3), and it is made of P-type semiconductor with a higher impurity concentration than the base region 31. The cathode region 33 forms the cathode region of the temperature detection diode TD1, and it is made of N-type semiconductor with a high impurity concentration. The gate electrode 34 is a gate of the power transistor M0, and it is made of polysilicon. The gate electrode 34 may be eliminated in the diode cell DCELL. The first contact hole 35 is a region where wiring (wiring 37 in FIG. 3) connected to the cathode of the temperature detection diode TD1 is formed. The second contact hole 36 is a region where wiring connected to the anode of the temperature detection diode TD1 is formed. In this exemplary embodiment, because the anode of the temperature detection diode TD1 is connected in common to the source of the power transistor M0, the wiring 26 (FIG. 3) that is connected to the source of the power transistor M0 is formed in the second contact hole 36.

Figure 3:
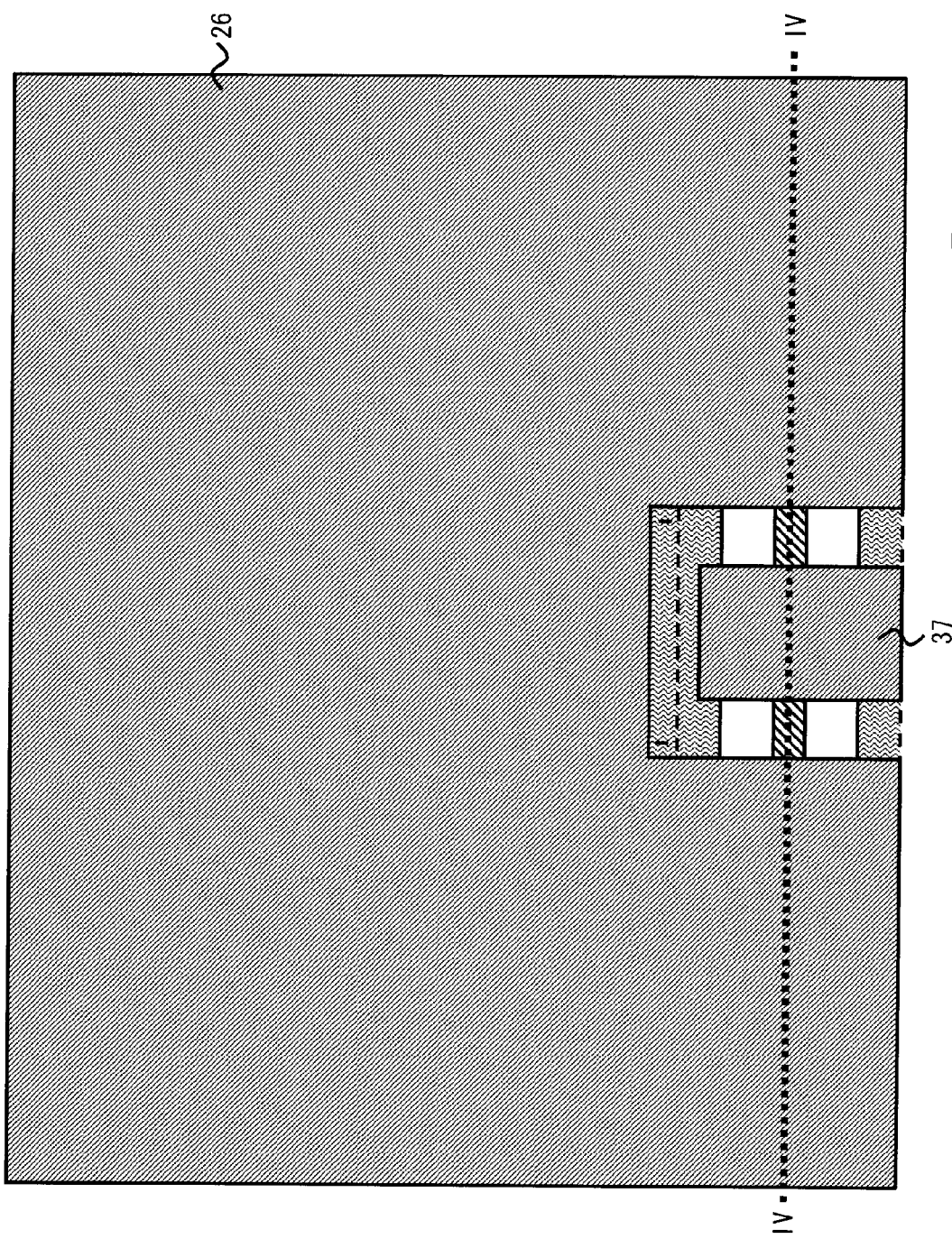
FIG. 3 is a layout view in which a wiring layer is added in the upper layer of the layout shown in FIG. 2.

FIG. 3 is a layout view to which the layout of a wiring layer is added to the layout view shown in FIG. 2. The wiring 26 in FIG. 3 is wiring that is connected to the source region of the power transistor M0 and the anode region of the temperature detection diode TD1. As shown in FIG. 3, the wiring 37 that is connected to the cathode region of the temperature detection diode TD1 is placed in isolation from the wiring 26.

Figure 4:
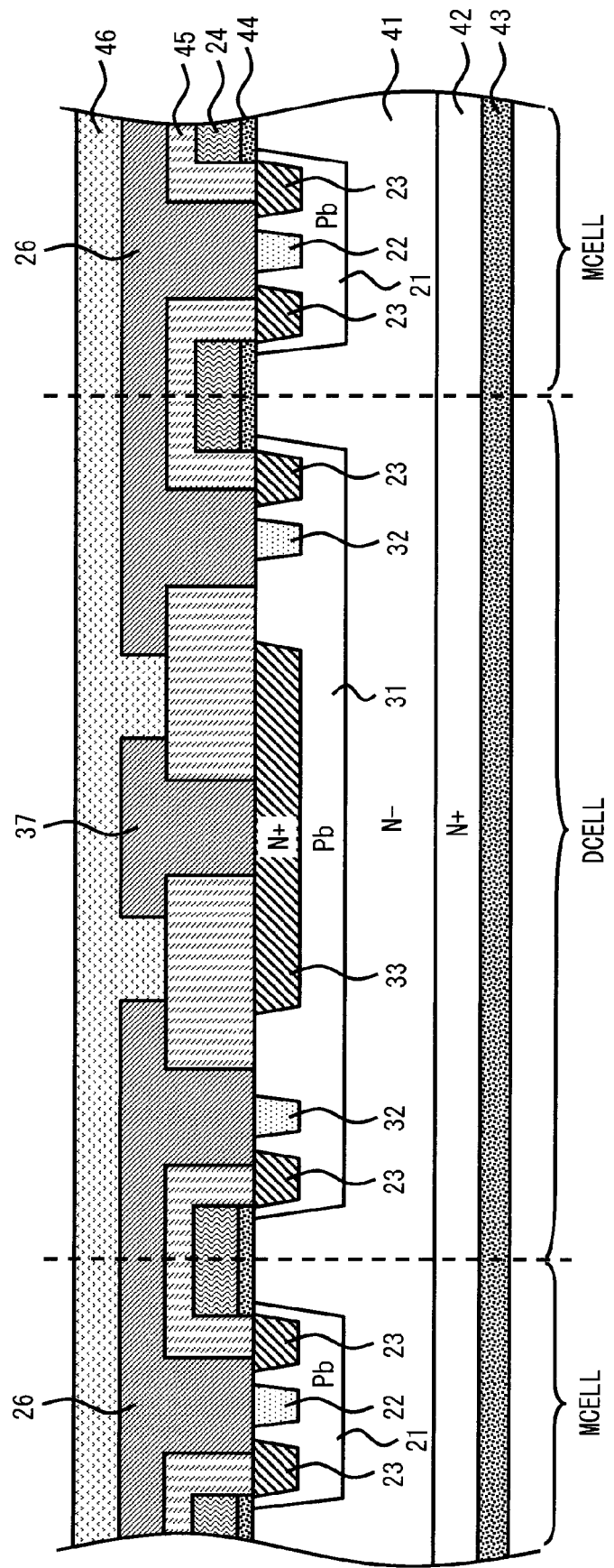
FIG. 4 is a sectional view showing a structure of a power transistor and a temperature detection diode according to the first exemplary embodiment.

FIG. 4 is a sectional view of the semiconductor apparatus 1 along line IV-IV in the layout view shown in FIG. 3. The sectional view shown in FIG. 4 is to explain the sectional structure of the power transistor M0 and the temperature detection diode TD1.

As shown in FIG. 4, in the semiconductor apparatus 1, a drain electrode 43 is formed on the backside (e.g. a surface opposite to the surface where the gate is formed) of the semiconductor substrate. In the layer above the drain electrode 43, an N+ semiconductor substrate layer 42 is formed. The N+ semiconductor substrate layer 42 is made of N-type semiconductor with a high impurity concentration. In the layer above the N+ semiconductor substrate layer 42, an N– epitaxial layer 41 is formed. The N– epitaxial layer 41 is made of N-type semiconductor with a lower impurity concentration than the N+ semiconductor substrate layer 42.

In the layer above the N– epitaxial layer 41 and in an area other than the underneath of the gate electrode, the base regions 21 and 31 are formed. The base regions 21 and 31 are formed by a diffusion step that is performed after formation of the gate electrode 24. Thus, the base regions 21 and 31 are partly formed under the gate electrode 24 also due to diffusion of impurity in the diffusion step. The base regions 21 and 31 are made of P-type semiconductor. In FIG. 4, the base regions 21 and 31 are marked with a symbol Pb. In the layer above the base regions 21 and 31 and in an area adjacent to the gate electrode 24, the source region 23 is formed. Further, the cathode region 33 is formed in the upper layer of the base region 31. The source region 23 and the cathode region 33 are formed in the same step, and they are made of N-type semiconductor with a high impurity concentration. Further, the base pull tap region 22 is formed in the layer above the base region 21, and the base pull tap region 32 is formed in the layer above the base region 31. The base pull tap regions are made of P-type semiconductor with a higher impurity concentration than the base regions.

On the surface of the semiconductor substrate, the gate electrode 24 is formed with a gate insulating film 44 interposed therebetween. In the layer above the gate electrode 24 and on the surface of the semiconductor substrate where the gate electrode 24 is not formed, an insulating film 45 is formed. The insulating film 45 has an opening. The opening that is made above the base pull tap region 22 and partly above the source region 23 of the MOS cell MCELL is the contact hole 25. The opening that is made above the base pull tap region 32 and partly above the source region 23 of the diode cell DCELL is the second contact hole 36. The opening that is made partly above the cathode region 33 of the diode cell DCELL is the first contact hole 35. Further, the wiring 26 is formed over the contact hole 25, the second contact hole 36 and the insulating film 45. On the other hand, the wiring 37 is formed over the first contact hole 35 and the insulating film 45. Then, a cover layer 46 is formed to cover the insulating film 45 and the wiring 26 and 37.

As described above, in the semiconductor apparatus 1 according to the exemplary embodiment, the temperature detection diode TD1 is formed in the same step as the power transistor M0. Thus, no additional step is needed to form the temperature detection diode TD1.

Figure 5:
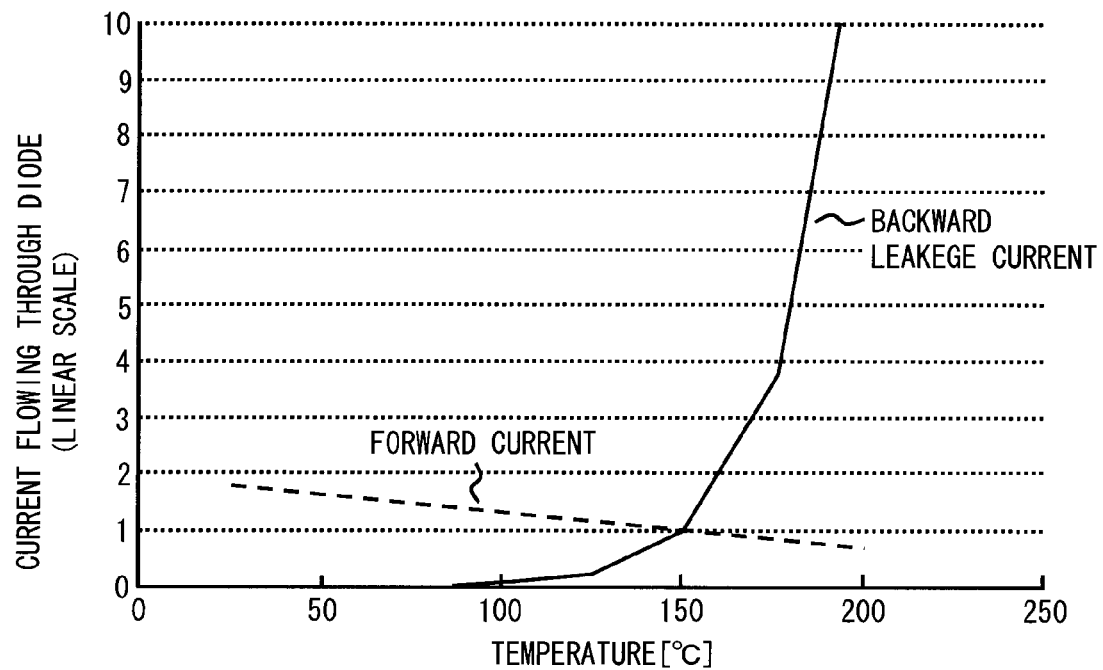
FIG. 5 is a graph showing temperature characteristics of a backward leakage current of a temperature detection diode according to the first exemplary embodiment in a linear scale.
Figure 6:
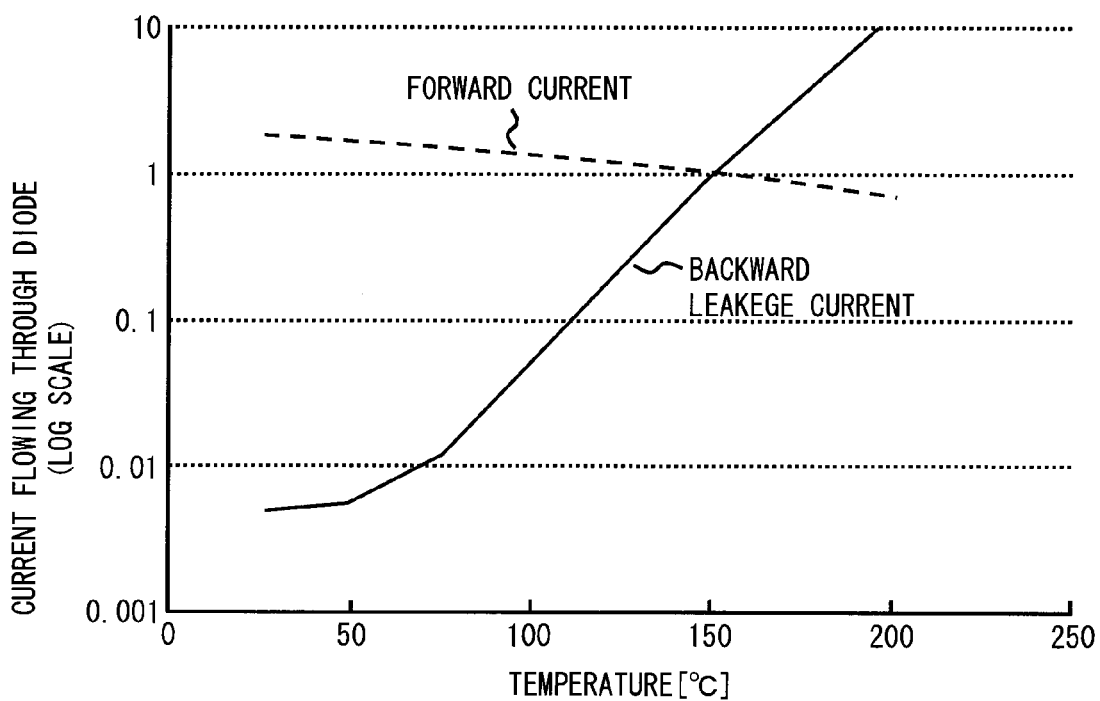
FIG. 6 is a graph showing temperature characteristics of a backward leakage current of a temperature detection diode according to the first exemplary embodiment in a log scale.

The characteristics of the temperature detection diode TD1 according to the exemplary embodiment are described hereinbelow. In this exemplary embodiment, temperature characteristics of the backward leakage current flowing from the cathode to the anode of the temperature detection diode TD1 are utilized. FIGS. 5 and 6 are graphs showing temperature characteristics of the backward leakage current. The graphs of FIGS. 5 and 6 show a rate of change in the backward leakage current with respect to temperature, assuming that the backward leakage current when the temperature of the semiconductor substrate is 150° C. is 1. FIGS. 5 and 6 also show a rate of change in the forward current of the temperature detection diode TD1 with respect to temperature in the same manner as the backward leakage current, for comparison with the backward leakage current. In FIG. 5, the vertical axis is in a linear scale. In FIG. 6, the vertical axis is in a log scale.

FIGS. 5 and 6 show that the forward current linearly changes with respect to temperature, and the backward leakage current changes exponentially. In the example shown in FIGS. 5 and 6, a rate of change in the forward current at around 150° C. is about –0.66%/° C., and a rate of change in the backward leakage current is about 7.00%/° C. Thus, the backward leakage current has sensitivity of about ten times higher than the forward current with respect to temperature.

Next, an operation of the semiconductor apparatus 1 according to the first exemplary embodiment with use of the temperature detection diode TD1 is described hereinbelow. In the following, an operation of the semiconductor apparatus 1 that makes transition from a normal state when the semiconductor apparatus 1 supplies a current to a load, to an overheat protection operation by an overheat detection circuit, and then returns to its original state from the overheat protection state is described. In the following description, it is assumed that the power supply voltage VCC is 14V, the intermediate voltage VCM is 9V, a resistance value of the first conversion resistor R1 is 400 kΩ, a resistance value of the second conversion resistor R2 is 1000 kΩ, a resistance value of the third conversion resistor R3 is 10 kΩ, and a transistor size ratio of the first internal output transistor M1 and the second internal output transistor M2 is 1:10.

A normal operation state when the semiconductor apparatus 1 supplies a current to the load RL is described firstly. In this state, the driver circuit 14 sets the drive signal S4 to High level, so that a voltage difference of 10V, for example, is generated between the gate and the source of the power transistor M0. The power transistor M0 is thereby brought into conduction. As a result that the power transistor M0 becomes conductive, a current IO flows to the load RL that is connected to the source of the power transistor M0. The current IO has a level of about 10 A, for example. As a result that the current flows to the load RL, the source voltage of the power transistor M0 becomes substantially equal to the drain voltage. For example, when a drain voltage VD is 14V, which is equal to the power supply voltage VCC, a source voltage VS becomes about 13.9V.

Because the current flows through the power transistor M0, heat is generated in the semiconductor substrate on which the power transistor M0 is formed, and the temperature of the semiconductor substrate rises. For example, if a drain-source voltage VDS of the power transistor M0 is VD–VS=0.1V, an output current IO of the power transistor M0 is 10 A, and a heat resistance Rth of the semiconductor substrate is 2° C./W, the temperature rise in the semiconductor substrate that occurs when the current flows through the power transistor M0 is 0.1V×10 A×2° C./W=2° C. Thus, if the ambient temperature is 25° C., the temperature of the temperature detection diode TD1 is 25° C.+2° C.=27° C.

Further, because the drain-source voltage of the power transistor M0 is 0.1V, a voltage of about 0.1V is applied between the cathode and the anode of the temperature detection diode TD1. The backward leakage current of the temperature detection diode TD1 when the temperature of the temperature detection diode TD1 is 27° C. is about I1=10 pA, for example. The current amplifier 11 amplifies the backward leakage current I1 and outputs the detection current I3. The detection current I3 is 10 pA×1000=10 nA. The voltage level of the overheat detection signal S2 corresponding to the detection current I3 is 14V−400 kΩ×10 nA=13.996V, which is High level.

Next, a state where an excessive current flows through the power transistor M0 due to a short-circuit of the load RL or the like and thus the temperature of the semiconductor substrate rises is described hereinbelow. It is assumed in this example that a current of 100 A flows through the power transistor M0 due to the short-circuit of the load RL (IO=100 A). When the load RL is short-circuited, the source voltage of the power transistor M0 becomes 0V (VS=0V). Thus, the drain-source voltage VDS of the power transistor M0 is 14V. Accordingly, the temperature of the semiconductor substrate on which the power transistor M0 is formed rises abruptly. For example, if a transient thermal impedance Zth (1 ms) of the semiconductor substrate is 0.106° C./W when the drain-source voltage VDS of the power transistor M0 is 14V, the current IO flowing through the power transistor M0 is 100 A and a pulse of 1 ms is applied, the temperature rise of the semiconductor substrate due to an excessive current is 14V× 100 A×0.106° C./W=148° C. Then, if the temperature of the semiconductor substrate before the short-circuit of the load RL occurs is 27° C., the temperature of the semiconductor substrate after 1 ms from the occurrence of the short-circuit of the load RL is 27° C.+148° C.=175° C.

An operation that the semiconductor apparatus 1 detects the overheated state due to the short-circuit of the load RL is described hereinafter. Because the drain-source voltage VDS of the power transistor M0 becomes 14V by the short-circuit of the load RL, a voltage of about 14V is applied between the anode and the cathode of the temperature detection diode TD1. The backward leakage current I1 that flows from the cathode to the anode of the temperature detection diode TD1 is 10 nA. The backward leakage current I1 is amplified by the current amplifier 11 and output as the detection current I3. The detection current I3 at this point is 10 nA×1000=1 μA. Then, a voltage level of the overheat detection signal S2 changes with the change in the detection current I3. A voltage level of the overheat detection signal S2 after change is 14V− 400 kΩ×1 μA=10V. The voltage level (10V) is a value indicating the logical Low level because the amplitude range of the overheat detection signal S2 is 9V to 14V. Thus, the temperature detection circuit 10 sets the overheat detection signal S2 to Low level in the state where the temperature of the semiconductor substrate reaches 175° C. In response to the change in the logical level of the overheat detection signal S2, the gating circuit 13 sets the output signal S3 to Low level. Further, in response to that the output signal S3 becomes Low level, the driver circuit 14 sets the drive signal S4 to Low level, thereby driving the power transistor M0 into cutoff. This interrupts the current flowing to the power transistor M0, so that current supply to the load RL is shut off.

After that, anomaly of the load RL is eliminated, and the short-circuit of the load RL is removed.

Further, as a result that the power transistor M0 is set to a cutoff state (IO=0 A) by the operation of the temperature detection circuit 10, the temperature of the semiconductor substrate falls. For example, if a transient thermal impedance Zth (2 ms) of the semiconductor substrate is 0.12° C./W when the drain-source voltage VDS of the power transistor M0 is 14V, the current IO flowing through the power transistor M0 is 0 A and a pulse of 2 ms is applied, the temperature fall is 14V×100 A×(0.12° C./W−0.106° C./W)=20° C. Thus, if the temperature of the semiconductor substrate before the short-circuit of the load RL occurs is 27° C., it takes 1 ms from the occurrence of the short-circuit of the load RL until the power transistor M0 enters the cutoff state, and the temperature of the temperature detection diode TD1 becomes 27° C.+20° C.=47° C. after 1 ms.

An operation that the semiconductor apparatus 1 returns to its original state from the overheat protection state is described hereinbelow. In this example, the return operation when the temperature of the temperature detection diode TD1 becomes 47° C. is described. When the temperature of the temperature detection diode TD1 is 47° C., the backward leakage current I1 flowing through the temperature detection diode TD1 is assumed to be about 15 pA. The backward leakage current I1 is amplified by the current amplifier 11 and output as the detection current I3. The detection current I3 at this point is 15 pA×1000=15 nA. Then, a voltage level of the overheat detection signal S2 changes with the change in the detection current I3. A voltage level of the overheat detection signal S2 after change is 14V−400 kΩ×15 nA=13.994V, which is high level. In this manner, when the temperature of the semiconductor substrate falls in the semiconductor apparatus 1, the overheat detection signal S2 is set back to Low level, so that the gating circuit 13 passes the control signal S1 as the output signal S3 to the driver circuit 14, thereby bringing the power transistor M0 into conduction.

As described above, the semiconductor apparatus 1 according to the exemplary embodiment amplifies the backward leakage current having a higher rate of change with respect to temperature than the forward current and determines the logical level of the overheat detection signal S2 based on the amplified backward leakage current. The semiconductor apparatus 1 can thereby detect the temperature of the semiconductor substrate in which the power transistor M0 is formed with high accuracy. The semiconductor apparatus 1 can further cut off the power transistor M0 at high speed based on the accurately detected temperature. The semiconductor apparatus 1 can thereby improve the accuracy of protection of the power transistor M0 from the overheated state.

Further, in the semiconductor apparatus 1 according to the exemplary embodiment, the current gain of the backward leakage current I1 in the temperature detection circuit 10 is determined based on the resistance ratio of resistors and the transistor size ratio of transistors. Generally, in the semiconductor apparatus 1, elements formed on the same semiconductor substrate have high parameter ratio accuracy. The temperature detection circuit 10 can thereby maintain the stable current gain even when variations occur in the circuit elements constituting the temperature detection circuit 10.

In the technique disclosed in U.S. Pat. No. 6,046,470, a current flows to the diode D2 in the forward direction. Therefore, a parasitic NPN bipolar transistor is formed in the diode D2 as described in U.S. Pat. No. 6,046,470. The current gain of the parasitic NPN bipolar transistor varies largely with temperature, voltage or manufacturing variability. The technique disclosed in U.S. Pat. No. 6,046,470 thus has a problem that the temperature detection accuracy varies due to the variation of the current gain of the parasitic NPN bipolar transistor.

In the technique disclosed in U.S. Pat. No. 6,046,470, in order to prevent degradation of the temperature detection accuracy due to the variation of the current gain of the parasitic NPN bipolar transistor, a P-tub region is formed separately in a base region to serve as the anode region of the diode D2. Because the P-tub region does not exist in another element, an additional step of forming the P-tub region is needed.

On the other hand, in the semiconductor apparatus 1 according to the exemplary embodiment, because a backward bias voltage is applied to the temperature detection diode TD1, a parasitic NPN bipolar transistor is not formed in the temperature detection diode TD1. Specifically, in the temperature detection diode TD1 according to the exemplary embodiment, because the relationship of a voltage Vd of the N+ semiconductor substrate layer 42 and the N− epitaxial layer 41 corresponding to the collector region of the parasitic NPN bipolar transistor, a voltage Va of the base region 31 corresponding to the base region of the parasitic NPN bipolar transistor, and a voltage Vk of the cathode region 33 corresponding to the emitter region of the parasitic NPN bipolar transistor satisfies Vd>Va>Vk, a base-emitter voltage of the parasitic NPN bipolar transistor does not generate a voltage difference that causes the parasitic NPN bipolar transistor to operate.

Therefore, when forming the temperature detection diode TD1 according to the exemplary embodiment, an additional step such as forming the P-tub region is not needed. Particularly, because the temperature detection diode TD1 according to the exemplary embodiment is formed by using part of a step of forming the power transistor M0 as described above, there is no increase in manufacturing step by addition of the temperature detection diode TD1.

Further, in the technique disclosed in U.S. Pat. No. 6,046,470, a vertical MOS transistor having a trench structure is used as the MOSFET 110. In the technique disclosed in Japanese Unexamined Patent Application Publication No. 06-232410, the diode D2 and the MOSFET 110 are isolated by using a trench. The trench generally has a low heat transfer rate. For example, while the heat transfer rate of silicon is about 150 W/m/k, the heat transfer rate of a silicon oxide film formed in the trench is about 10 W/m/k, and there is about a 15-times difference in heat transfer rate. The diode D2 described in U.S. Pat. No. 6,046,470 thus has a problem that heat generated in the MOSFET 110 is difficult to be transferred.

On the other hand, the power transistor M0 according to the exemplary embodiment is a planar-type vertical MOS transistor without use of a trench. Therefore, in the semiconductor apparatus 1 according to the exemplary embodiment, the power transistor M0 and the temperature detection diode TD1 are not isolated by a trench. Thus, in the semiconductor apparatus 1 according to the exemplary embodiment, heat generated in the power transistor M0 is easily transferred to the temperature detection diode TD1. It is thereby possible to improve the accuracy of temperature detection in the semiconductor apparatus 1 according to the exemplary embodiment.

Furthermore, in the technique disclosed in U.S. Pat. No. 6,046,470, the temperature detection circuit operates on the basis of a source potential of the MOSFET 110. The source potential of the MOSFET 110 widely varies due to on/off operation of the MOSFET 110. Therefore, it is necessary to separately prepare a power supply circuit for stabilizing the source potential in the technique disclosed in U.S. Pat. No. 6,046,470. The power supply circuit that is prepared separately needs to be designed so as not to generate noise or spike in an output voltage in order to prevent malfunction of the temperature detection circuit. In order to suppress noise or spike, it is necessary to incorporate a capacitor or a protection diode into the power supply circuit. However, incorporation of the capacitor or the protection diode is addition of a circuit element, which leads to an increase in package area and an increase in parts cost.

On the other hand, the semiconductor apparatus 1 according to the exemplary embodiment operates based on the power supply voltage VCC and the intermediate voltage VCM that remain stable even upon on/off switching of the power transistor M0. Therefore, it is not necessary to separately place a power supply circuit that outputs a stable voltage in the semiconductor apparatus 1 according to the exemplary embodiment. Because there is no need to separately place a highly accurate power supply circuit, it is possible to reduce the circuit scale and parts cost in the semiconductor apparatus 1 according to the exemplary embodiment.

Further, in the technique disclosed in Japanese Unexamined Patent Application Publication No. 06-232410, the gate-source voltage of the MOS transistor 210 is set to 0V after detecting the overheated state. Therefore, the detection signal So does not return to High level even after the temperature of the semiconductor substrate falls in the technique disclosed in Japanese Unexamined Patent Application Publication No. 06-232410. The technique disclosed in Japanese Unexamined Patent Application Publication No. 06-232410 thus has a problem that it is unable to return to a normal operation state after detecting the overheated state. On the other hand, in the semiconductor apparatus 1 according to the exemplary embodiment, the temperature detection diode TD1 is placed between the source and the drain of the power transistor M0. It is thus possible to perform the temperature detection operation by the temperature detection diode TD1 independently of the on/off operation of the power transistor M0. The semiconductor apparatus 1 can implement the return operation from the overheat protection state, which has been impossible in the technique disclosed in Japanese Unexamined Patent Application Publication No. 06-232410.

[Second Exemplary Embodiment]

Figure 7:
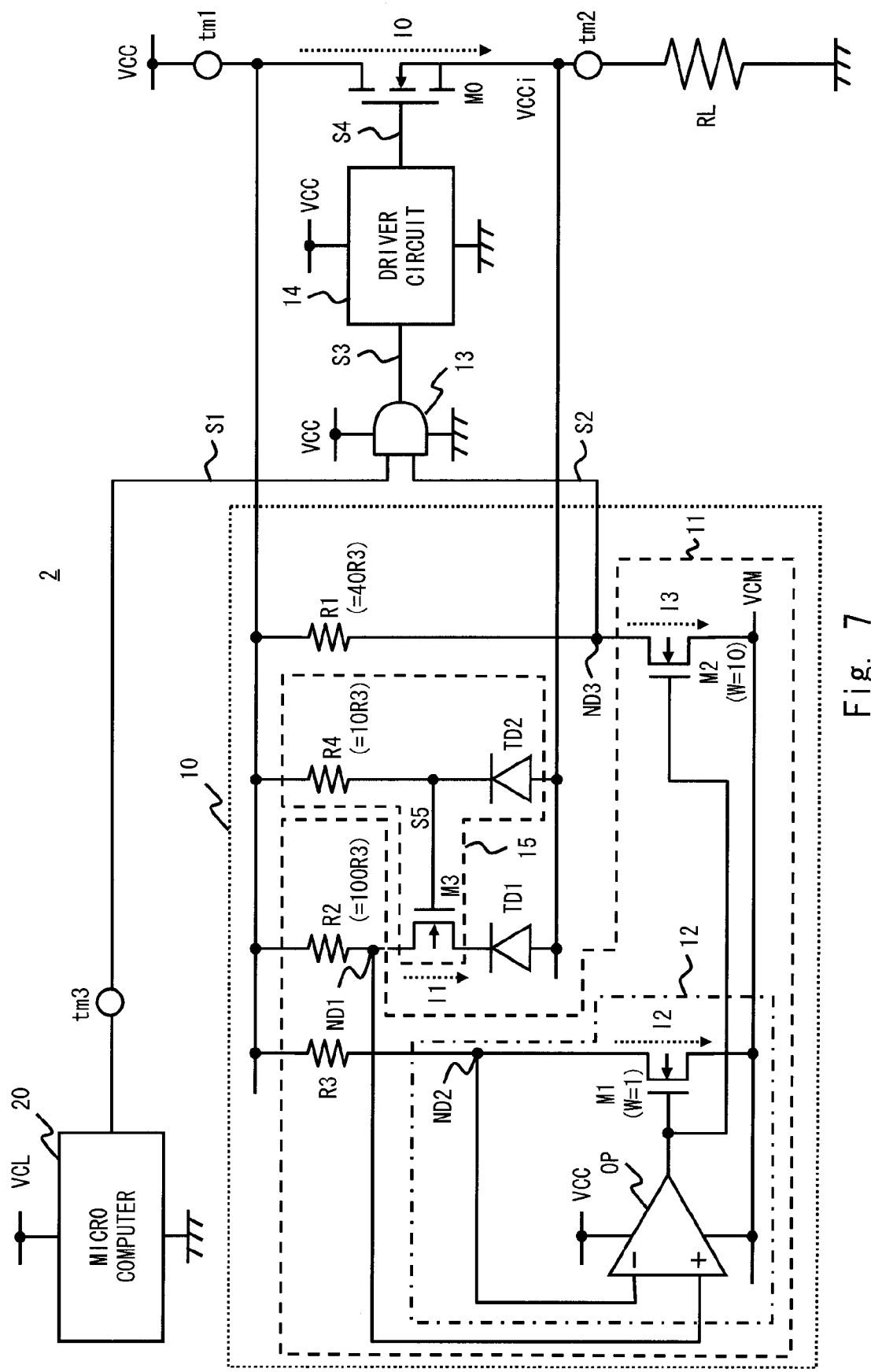
FIG. 7 is a block diagram of a semiconductor apparatus according to a second exemplary embodiment.
Figure 8:
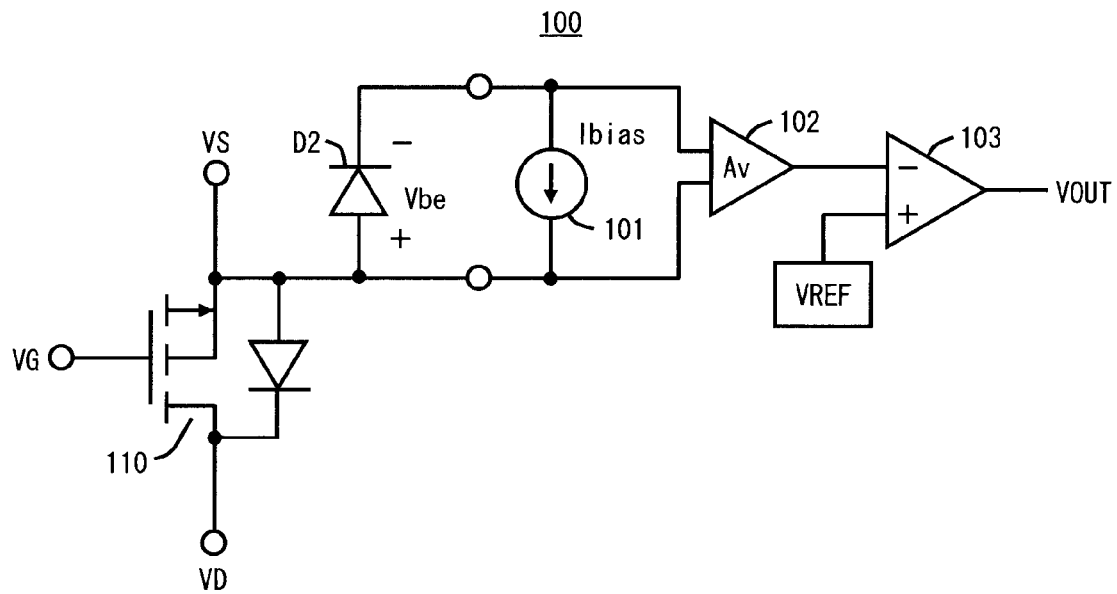
FIG. 8 is a circuit diagram of a protection circuit disclosed in U.S. Pat. No. 6,046,470.
Figure 9:
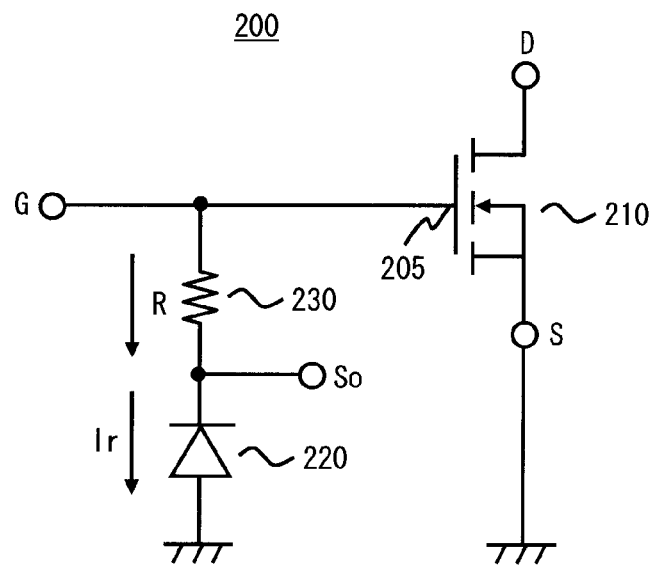
FIG. 9 is an equivalent circuit diagram of a MOS semiconductor device disclosed in Japanese Unexamined Patent Application Publication No. 06-232410.

FIG. 7 is a block diagram of a semiconductor apparatus 2 according to a second exemplary embodiment of the invention. Referring to FIG. 7, the semiconductor apparatus 2 according to the second exemplary embodiment has a structure in which an overvoltage protection circuit 15 is added to the semiconductor apparatus 1 according to the first exemplary embodiment. The temperature detection diode TD1 mostly has a breakdown voltage of usually 3V to 9V. Therefore, when the drain-source voltage VDS of the power transistor M0 becomes equal to or higher than the breakdown voltage, a breakdown current flows to the temperature detection diode TD1, which hinders accurate temperature detection. In light of this, the overvoltage protection circuit 15 that prevents breakdown of the temperature detection diode TD1 is added in the second exemplary embodiment.

The overvoltage protection circuit 15 includes an overvoltage protection diode TD2, a fourth conversion resistor R4, and an overvoltage protection transistor M3. The cathode of the overvoltage protection diode TD2 is connected to the input terminal tm1, and the anode of the overvoltage protection diode TD2 is connected to the output terminal tm2. The fourth conversion resistor R4 is placed between the input terminal tm1 and the cathode of the overvoltage protection diode TD2. The fourth conversion resistor R4 converts the backward leakage current flowing through the overvoltage protection diode TD2 into a voltage and generates an overvoltage detection signal S5. The overvoltage protection transistor M3 is placed between the cathode of the temperature detection diode TD1 and the second conversion resistor R2 of the current amplifier 11. Further, the conductive state of the overvoltage protection transistor M3 is controlled based on the overvoltage detection signal S5. Note that a diode having a lower breakdown voltage than the temperature detection diode TD1 is used as the overvoltage protection diode TD2 in the second exemplary embodiment.

An operation of the overvoltage protection circuit 15 is described hereinbelow. In the following description, it is assumed that a breakdown voltage of the overvoltage protection diode TD2 is 6V, and a threshold voltage VT of the overvoltage protection transistor M3 is 1V. Then, a case is assumed where a defect such as a short-circuit occurs in the load RL and the source voltage of the power transistor M0 becomes 0V.

In this case, a voltage of 14V is applied to both ends of the overvoltage protection circuit 15. At this time, in the overvoltage protection circuit 15, the overvoltage protection diode TD2 is broken down, and the voltage at the cathode is 6V, which is the breakdown voltage. Accordingly, 6V is applied as the overvoltage detection signal S5 to the gate of the overvoltage protection transistor M3. At this time, the source voltage of the overvoltage protection transistor M3 is a value obtained by subtracting the threshold voltage VT (1V) of the overvoltage protection transistor M3 from the voltage of the overvoltage detection signal S5. Thus, in this case also, a voltage of only 5V (=6V−1V) is applied between the anode and the cathode of the temperature detection diode TD1. Because the voltage is lower than the breakdown voltage of the temperature detection diode TD1, breakdown of the temperature detection diode TD1 is prevented.

As described above, because the overvoltage protection circuit 15 is placed in the semiconductor apparatus 2 according to the second exemplary embodiment, it is possible to prevent the breakdown of the temperature detection diode TD1 even when the drain-source voltage VDS of the power transistor M0 becomes larger than the breakdown voltage of the temperature detection diode TD1. A breakdown current does not thereby flows to the temperature detection diode TD1, and the semiconductor apparatus 2 according to the second exemplary embodiment can maintain the high temperature detection accuracy.

The first and second exemplary embodiments can be combined as desirable by one of ordinary skill in the art. While the invention has been described in terms of several exemplary embodiments, those skilled in the art will recognize that the invention can be practiced with various modifications within the spirit and scope of the appended claims and the invention is not limited to the examples described above.

Further, the scope of the claims is not limited by the exemplary embodiments described above.

Furthermore, it is noted that, Applicant's intent is to encompass equivalents of all claim elements, even if amended later during prosecution.

For example, the current gain of the current amplifier is not limited to the gain described in the above exemplary embodiments but may be determined as appropriate according to system characteristics. Further, the structure of the current amplifier can be modified as appropriate according to a system configuration.

What is claimed is:

1. A semiconductor apparatus comprising:
    a power transistor that is placed between an input terminal and an output terminal;
    a temperature detection diode that has a cathode connected to the input terminal and an anode connected to the output terminal;
    a current amplifier that outputs a detection current generated by amplifying a backward leakage current flowing from the cathode to the anode of the temperature detection diode;
    a first conversion resistor that outputs an overheat detection signal generated by converting the detection current into a voltage;
    a gating circuit that performs gating of a control signal according to the overheat detection signal;
    a driver circuit that outputs a drive signal to a control terminal of the power transistor based on an output signal of the gating circuit; and
    an overvoltage protection circuit configured to prevent breakdown current flowing to the temperature detection diode when a drain-source voltage of the power transistor becomes equal to or higher than a breakdown voltage,
    wherein the current amplifier includes a second conversion resistor that is connected between the cathode of the temperature detection diode and the input terminal and generates a leakage voltage by converting the backward leakage current into a voltage,
    wherein the overvoltage protection circuit comprises:
    an overvoltage protection diode that has a cathode connected to the input terminal and an anode connected to the output terminal;
    a fourth conversion resistor that is placed between the input terminal and the cathode of the overvoltage protection diode and generates an overvoltage detection signal by converting a current flowing through the overvoltage protection diode into a voltage; and
    an overvoltage protection transistor that is placed between the cathode of the overvoltage protection diode and the second conversion resistor of the current amplifier and has a conduct state controlled based on the overvoltage detection signal.

2. The semiconductor apparatus according to claim 1, wherein
    the current amplifier operates based on a first voltage input to the input terminal and a second voltage lower than the first voltage, and
    the current amplifier includes:
    a third conversion resistor that is connected between an internal output node and the input terminal;
    a buffer circuit that generates a reference voltage corresponding to the leakage voltage at the internal output node according to a current flowing through the third conversion resistor; and
    a second internal output transistor that has a control terminal connected in common to a control terminal of a first internal output transistor of the buffer circuit, a source connected to an internal power supply terminal that supplies the second voltage, and a drain connected to the input terminal through the first conversion resistor.

3. The semiconductor apparatus according to claim 2, wherein a current gain of the current amplifier is determined by a product of a first amplification ratio indicating a resistance ratio of the second conversion resistor and the third conversion resistor and a second amplification ratio indicating a transistor size ratio of the first internal output transistor and the second internal output transistor.

4. The semiconductor apparatus according to claim 1, wherein the fourth conversion resistor has a lower resistance value than the second conversion resistor.

5. The semiconductor apparatus according to claim 1, wherein the anode of the temperature detection diode is formed by the same process as a base region of the power transistor, and the cathode of the temperature detection diode is formed by the same process as a source region of the power transistor.

6. The semiconductor apparatus according to claim 1 wherein the power transistor is a planar-type vertical MOS transistor, and the temperature detection diode is placed adjacent to the power transistor.

7. A temperature detection circuit comprising:
a temperature detection diode that is placed in parallel with a power transistor between an input terminal and an output terminal and has a cathode connected to the input terminal and an anode connected to the output terminal;
a current amplifier that outputs a detection current generated by amplifying a backward leakage current flowing from the cathode to the anode of the temperature detection diode; and
a first conversion resistor that outputs an overheat detection signal generated by converting the detection current into a voltage; and
an overvoltage protection circuit configured to prevent breakdown current flowing to the temperature detection diode when a drain-source voltage of the power transistor becomes equal to or higher than a breakdown voltage,
wherein the current amplifier includes a second conversion resistor that is connected between the cathode of the temperature detection diode and the input terminal and generates a leakage voltage by converting the backward leakage current into a voltage, wherein the overvoltage protection circuit comprises:
an overvoltage protection diode that has a cathode connected to the input terminal and an anode connected to the output terminal;
a fourth conversion resistor that is aced between the input terminal and the cathode of overvoltage protection diode and generates an overvoltage detection signal by converting a current flowing through the overvoltage protection diode into a voltage; and
an overvoltage protection transistor that is a laced between the cathode of the overvoltage protection diode and the second conversion resistor of the current amplifier and has a conductive state controlled based on the overvoltage detection signal.

8. The temperature detection circuit according to claim 7, wherein
the current amplifier operates based on a first voltage input to the input terminal and a second voltage lower than the first voltage, and
the current amplifier includes:
a third conversion resistor that is connected between an internal output node and the input terminal;
a buffer circuit that generates a reference voltage corresponding to the leakage voltage according to a current flowing through the third conversion resistor; and
a second internal output transistor that has a control terminal connected in common to a control terminal of a first internal output transistor of the buffer circuit, a source connected to an internal power supply terminal that supplies the second voltage, and a drain connected to the input terminal through the first conversion resistor.

9. The temperature detection circuit according to claim 8, wherein a current gain of the current amplifier is determined by a product of a first amplification ratio indicating a resistance ratio of the second conversion resistor and the third conversion resistor and a second amplification ratio indicating a transistor size ratio of the first internal output transistor and the second internal output transistor.

10. The temperature detection circuit according to claim 7, wherein the fourth conversion resistor has a lower resistance value than the second conversion resistor.

11. The temperature detection circuit according to claim 7, wherein the anode of the temperature detection diode is formed by the same process as a base region of the power transistor. and the cathode of the temperature detection diode is formed by the same process as a source region of the power. transistor.

12. The temperature detection circuit according to claim 7, wherein the power transistor is a planar-type vertical MOS transistor, and the temperature detection diode is placed adjacent to the power transistor.

* * * * *